US007601624B2

(12) United States Patent
Rothenbury et al.

(10) Patent No.: US 7,601,624 B2

(45) Date of Patent: Oct. 13, 2009

(54) DEVICE COMPRISING AN OHMIC VIA CONTACT, AND METHOD OF FABRICATING THEREOF

(75) Inventors: David A. Rothenbury, Garland, TX (US); James D. Huffman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 465 days.

(21) Appl. No.: 11/520,378

(22) Filed: Sep. 13, 2006

(65) Prior Publication Data

US 2008/0064224 A1 Mar. 13, 2008

(51) Int. Cl.
*H01L 21/44* (2006.01)

(52) U.S. Cl. .............................. 438/597; 257/E21.507; 257/E21.538; 257/E21.627; 438/637; 438/643; 438/672; 438/761

(58) Field of Classification Search ................. 438/597, 438/598, 637, 643, 672, 761; 257/E21.507, 257/E21.538, E21.627
See application file for complete search history.

(56) References Cited

U.S. PATENT DOCUMENTS 6,177,350 B1 * 1/2001 Sundarrajan et al. ........ 438/688
6,569,783 B2 * 5/2003 Uzoh et al. ................. 438/785

* cited by examiner

*Primary Examiner*—Asok K Sarkar
(74) *Attorney, Agent, or Firm*—Charles A. Brill; Wade James Brady, III; Frederick J. Telecky, Jr.

(57) ABSTRACT

Device comprising an ohmic via contact, and method of fabricating thereof. A preferred embodiment comprises forming a metal layer over a substrate, forming a conductive barrier layer over the metal layer, depositing an insulating layer over the conductive barrier layer, creating an opening in the insulating layer to expose the conductive barrier layer, and forming a via contact in the opening. The conductive barrier layer protects the metal layer by preventing the formation of an oxide layer, which could reduce conductivity.

10 Claims, 8 Drawing Sheets

DEVICE COMPRISING AN OHMIC VIA CONTACT, AND METHOD OF FABRICATING THEREOF

TECHNICAL FIELD

The present invention relates generally to a semiconductor device and method of fabricating thereof, and more particularly to a device comprising an ohmic via contact and method of fabricating thereof.

BACKGROUND

Creating via contacts with ohmic behavior between layers of metal in a semiconductor device can be difficult to achieve because there will typically be a layer of native oxide present between the metal layers. Ohmic behavior is achieved with there is a linear relationship between a current flowing through the contact and a voltage drop across the contact. The native oxides of metals, such as aluminum oxide for aluminum or copper oxide for copper, tend to be insulators. The presence of the insulating layer can prevent the via contacts from having true ohmic behavior.

With reference now to FIG. 1, there is shown a diagram illustrating a cross sectional view of a portion of a prior art semiconductor device 100. The semiconductor device 100 includes a substrate 105 with metal layer 110 formed above the substrate 105. The substrate 105 may contain other structures that are not shown in FIG. 1. Formed above the metal layer 110 can be a layer of titanium nitride (TiN) 115 and a layer of an oxide material 120. The TiN layer 115 and the oxide layer 120 can form an antireflective coating (ARC).

The presence of the ARC can be specific to the semiconductor device 100 and may not be present in general. For example, in applications where light scattering from the surface of the semiconductor device 100 can cause a problem with image quality, the ARC may be created to help reduce the scattering of the light incident on the surface of the semiconductor device 100. In an application where scattered light is not a concern, it may not be necessary to create the ARC.

The TiN layer 115 and the oxide layer 120 may be etched to form an opening 122 for a via 130. The TiN layer 115 and the oxide layer 120 can then be covered by a spacer layer 125 that may be created from a photoresist material. The spacer layer 125 can then be patterned and the photoresist material can be removed with a photoresist develop process to form the via 130. The via 130 can then be filled with a metal, for example.

The etch of the TiN layer 115 and the oxide layer 120 down to the metal layer 110 would typically require two separate etch processes, and once the metal layer 110 is exposed, an oxide of the metal used in the metal layer 110 can form over the exposed portions of the metal layer 110. An expanded view of the semiconductor device 100 illustrates an oxide layer 135 formed between the metal layer 110 and the via 130 and the spacer layer 125 and the via 130.

With reference now to FIGS. 2*a* and 2*b*, there are shown diagrams illustrating an electron micrograph of a cross section of a prior art semiconductor device and a data plot of current versus voltage for typical via contacts formed as shown in FIG. 1. The diagram shown in FIG. 2*a* illustrates a via formed over a metal layer. The diagram shown in FIG. 2*b* illustrates a data plot of current versus voltage for exemplary via contacts. If the via contacts exhibited true ohmic behavior, the amperes versus volts plots would be linear. The amperes versus volts plots shown in FIG. 2*b* are clearly non-linear. Therefore, the via contacts do not exhibit ohmic behavior.

A technique that can be used to help create ohmic via contacts is to use a sputter etch to etch the metal layer, such as the metal layer 110, to help remove any oxide layer that may be covering the metal layer 110 prior to the creation of the via contact. With a sputter etch, the metal layer 110 is subject to bombardment by high energy ions to remove a portion of the metal layer. The high energy ions will also remove any oxide layer along with part of the metal layer.

One disadvantage of the prior art is that the use of the sputter etch requires an additional fabrication process step, which can increase the complexity of the fabrication process. The increased complexity can increase the fabrication costs as well as potentially decrease the yield of the fabrication process.

SUMMARY OF THE INVENTION

These and other problems are generally solved or circumvented, and technical advantages are generally achieved, by preferred embodiments of the present invention which provides a device comprising an ohmic via contact, and a method of fabricating thereof.

In accordance with a preferred embodiment of the present invention, a method for forming a via contact is provided. The method includes forming a metal layer over a substrate, forming a conductive barrier layer over the metal layer, and depositing an insulating layer over the conductive barrier layer. The method also includes creating a first opening in the insulating layer to expose the conductive barrier layer, depositing a spacer layer over the insulating layer and the exposed conductive barrier layer, creating a second opening in the spacer layer to re-expose at least a portion of the previously exposed conductive barrier layer, and forming a via contact in the second opening.

In accordance with another preferred embodiment of the present invention, a semiconductor device is provided. The semiconductor device includes a first metal layer disposed over a substrate with a conductive barrier layer created over portions of the first metal layer. The semiconductor device also includes an insulating layer disposed over the conductive barrier layer, with openings above portions of the conductive barrier layer. The semiconductor device further includes a second metal layer disposed above the insulating layer and via contacts formed inside the insulating layer. The via contacts are electrically connected to the first metal layer, the barrier layer, and the second metal layer, wherein the via contacts have a diameter smaller than that of the openings in the insulating layer, and the via contacts have a height greater than that of the insulating layer.

In accordance with another preferred embodiment of the present invention, an array of light modulators is provided. The array of light modulators includes a first metal layer disposed above a substrate containing addressing circuitry and memory cells, a conductive barrier layer disposed above portions of the first metal layer, and a first insulating layer disposed above the conductive barrier layer, wherein the first insulating layer contains first openings above portions of the conductive barrier layer. The array of light modulators also includes a second metal layer disposed above the first insulating layer, and a plurality of first via contacts formed inside the first openings in the first insulating layer and electrically connecting the first metal layer, the conductive barrier layer, and the second metal layer. The plurality of first via contacts have a diameter smaller than that of the first openings in the first insulating layer and the plurality of first via contacts have a height greater than that of the first insulating layer. The array of light modulators further includes a third metal layer disposed above the second metal layer and a plurality of second via contacts connecting the second metal layer and the third metal layer. The plurality of second via contacts support the third metal layer above the second metal layer such that the third metal layer is spatially separated from the second metal layer.

An advantage of a preferred embodiment of the present invention is that it can be very easy to incorporate the present invention into existing fabrication processes. In many situations, the inclusion of the present invention into an existing fabrication process can eliminate one or more fabrication processes. The elimination of the fabrication process(es) can help to reduce the cost of manufacturing as well as increase the fabrication yield.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an array of light modulators commonly referred to as a digital micromirror device (DMD). A DMD is a type of micro electrical-mechanical system that is used to modulate light in a micro-display based display system. The DMD comprises a large number of individual light modulators (micromirrors) arranged in an array, i.e., an array of light modulators. The invention may also be applied, however, to complementary metal oxide semiconductor (CMOS) semiconductor devices and integrated circuits, wherein there is a need to electrically connect metal layers with an ohmic via contact.

Figure 3A:
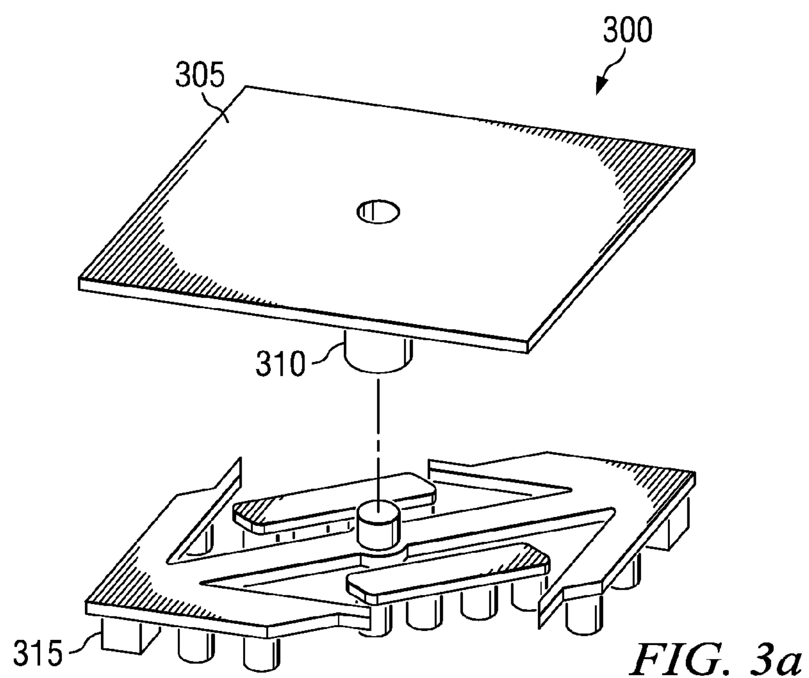
FIGS. 3*a* and 3*b* are diagrams of isometric views of portions of exemplary DMDs, according to a preferred embodiment of the present invention.
Figure 3B:
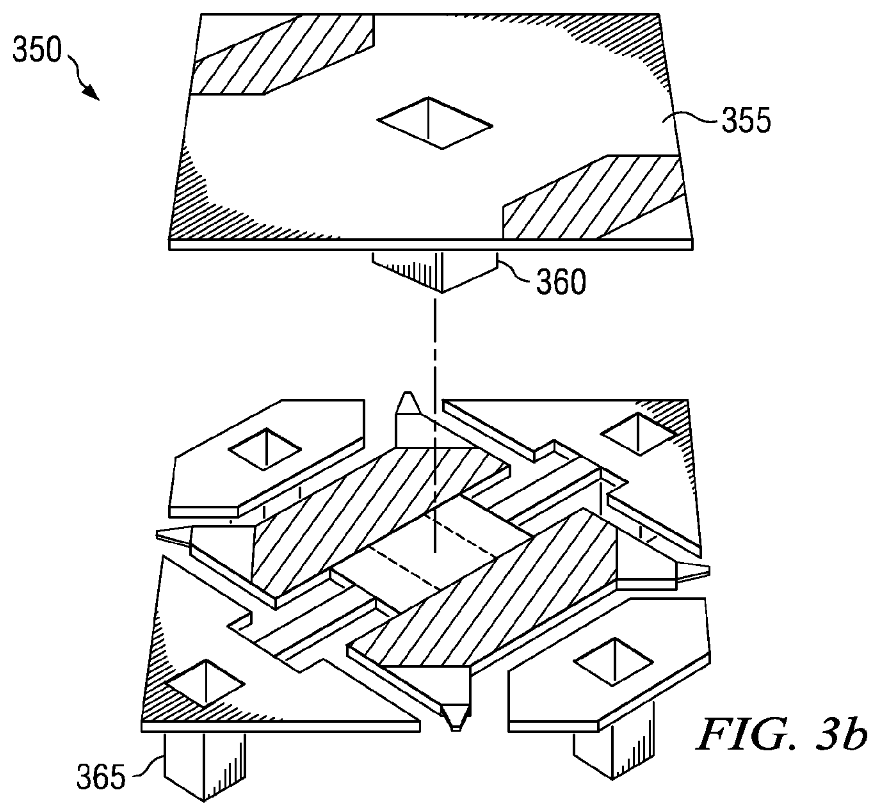

With reference now to FIGS. 3*a* and 3*b*, there are shown diagrams illustrating isometric views of portions of exemplary DMDs 300 (FIG. 3*a*) and 350 (FIG. 3*b*), according to a preferred embodiment of the present invention. A DMD, such as the DMDs 300 and 350 shown in FIGS. 3*a* and 3*b*, comprises a large number of micromirrors arranged in an array, with each micromirror pivoting about a hinge. A typical DMD will have micromirrors that can pivot between two states, an ON state and an OFF state. Depending on the state of a micromirror, the micromirror will reflect light from a light source either onto a display plane or away from the display plane. The combined effect of the large number of micromirrors in the array results in the formation of images on the display plane.

Micromirrors, such as a micromirror 305 (FIG. 3*a*) and 355 (FIG. 3*b*), can be mounted on a hinge by way of a via, such as a via 310 (FIG. 3*a*) and 360 (FIG. 3*b*). The vias 310 and 360 may function to physically couple the micromirrors 305 and 355 to the hinge. The hinge (along with hinge support structures and electrical circuitry) can also be coupled to a substrate (not shown) by vias, such as a via 315 and 365. The vias 315 and 365 may provide electrical connectivity as well as mechanical connectivity. Therefore, there is a need to create via contacts that possess ohmic behavior in addition to possessing good mechanical strength.

With reference now to FIGS. 4*a* through 4*i*, there are shown diagrams illustrating a portion of the fabrication of a semiconductor device 400 containing a via contact, according to a preferred embodiment of the present invention. The semiconductor device 400 may be a digital micromirror device (DMD). The fabrication of the semiconductor device 400 illustrates the creation of a via contact, such as the via 315 and the via 365 shown in FIGS. 3*a* and 3*b*, for example.

Figure 4A:
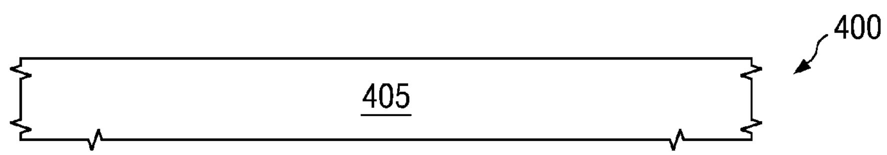
FIGS. 4*a* through 4*i* are diagrams of the fabrication of a semiconductor device containing a via contact, according to a preferred embodiment of the present invention.
Figure 4B:
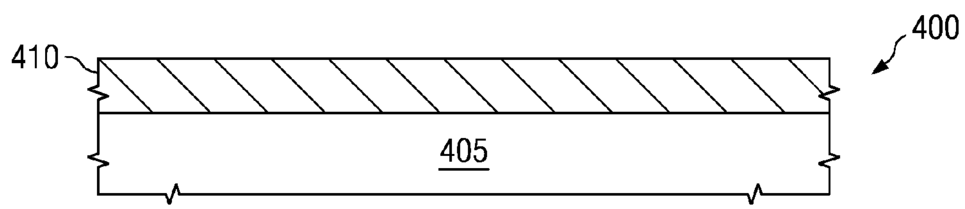

The fabrication of the semiconductor device 400 can begin with a substrate 405, as shown in FIG. 4*a*. The substrate 405 may be a bare substrate of silicon, for example. Alternatively, the substrate 405 may have undergone some earlier fabrication processes, such as the fabrication of active devices, conductors, memory cells, electrical addressing circuitry, and so forth. A first fabrication process of interest is shown in FIG. 4*b* and may involve the deposition of a metal layer 410 on the substrate 405. The metal layer 410 can be formed from aluminum, an aluminum alloy, copper, a copper alloy, and so on. The metal layer 410 can be created using a desired pattern to create desired metal layer structures (not shown) on the substrate 405.

Figure 4C:
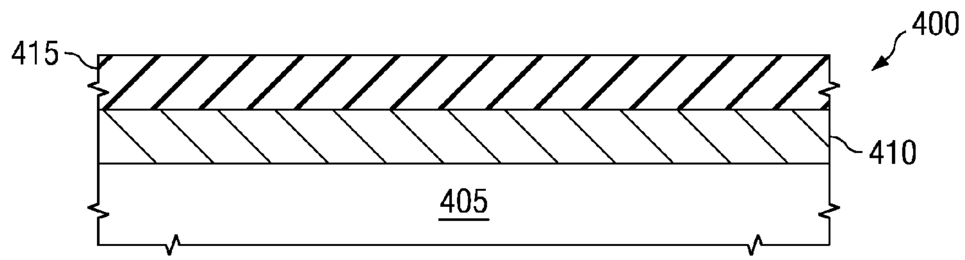

As shown in FIG. 4*c*, after the metal layer 410 has been created, the metal layer 410 can be covered with a barrier layer 415. According to various embodiments of the present invention, the barrier layer 415 can be a layer of titanium nitride (TiN), titanium dioxide, an alloy that produces a native oxide, or the like, deposited over the metal layer 410. In selecting the composition of the barrier layer 415, it is beneficial if this layer does not interact with the photoresist removal process. The barrier layer 415 can form a native oxide, such as TiON, on its surface, as long as the native oxide of the barrier layer 415 is conductive and does not significantly interfere with the ohmic behavior of the via contact. Although shown to be approximately the same thickness as the metal layer 410, the barrier layer 415, heretofore referred to as the TiN layer 415, can be thinner (or thicker) than the metal layer 410, with an actual thickness being dependent upon the intended functionality of the TiN layer 415. Titanium nitride is a conductive ceramic material that is extremely hard and can be deposited on the metal layer 410 using techniques such as physical vapor deposition (PVD) or chemical vapor deposition (CVD). The presence of the TiN layer 415 can prevent the metal layer 410 from oxidizing. In addition to being a protective coating for the metal layer 410, the TiN layer 415 is also conductive with a resistivity ranging from 30 to 70 ohm-centimeters.

Figure 4D:
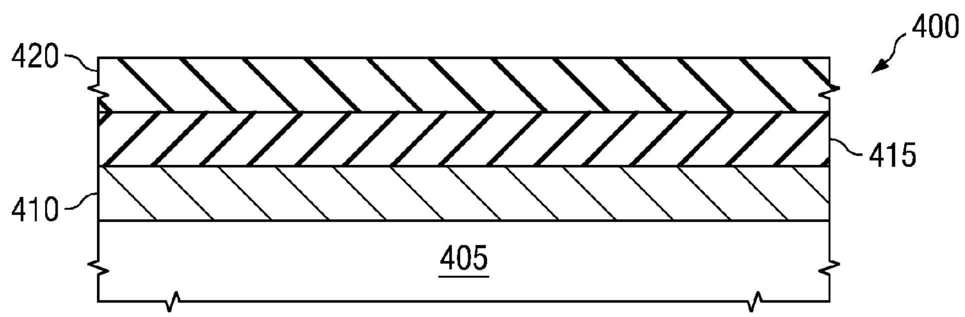

The diagram shown in FIG. 4*d* illustrates another fabrication process, wherein an oxide layer 420 is deposited over the TiN layer 415. The oxide layer 420 can be a layer of silicon oxide, titanium oxide, tantalum oxide, and so forth. The oxide layer 420 in conjunction with the TiN layer 415 create an antireflective coating (ARC) layer that can function as a light trap to help reduce light scatter and improve the image quality of the microdisplay based display system by increasing the contrast ratio of the images being displayed. The oxide layer 420 can be deposited using a CVD process. In applications that do not have a need to reduce light scatter, the oxide layer 420 may not be needed and can be eliminated. Alternate embodiments of the ARC can be possible, for example, an ARC can be created using more than the two layers of TiN and oxide. For example, alternating layers of TiN and oxide can be used. Additionally, materials other than oxide can be utilized.

Figure 1:
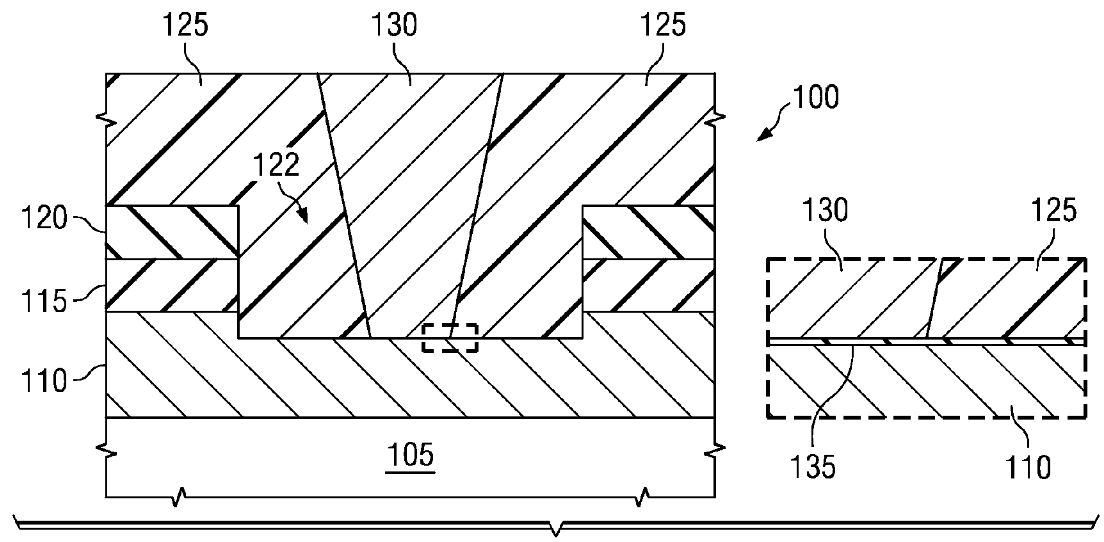
FIG. 1 is a diagram of a cross sectional view of a portion of a prior art semiconductor device.
Figure 2A:
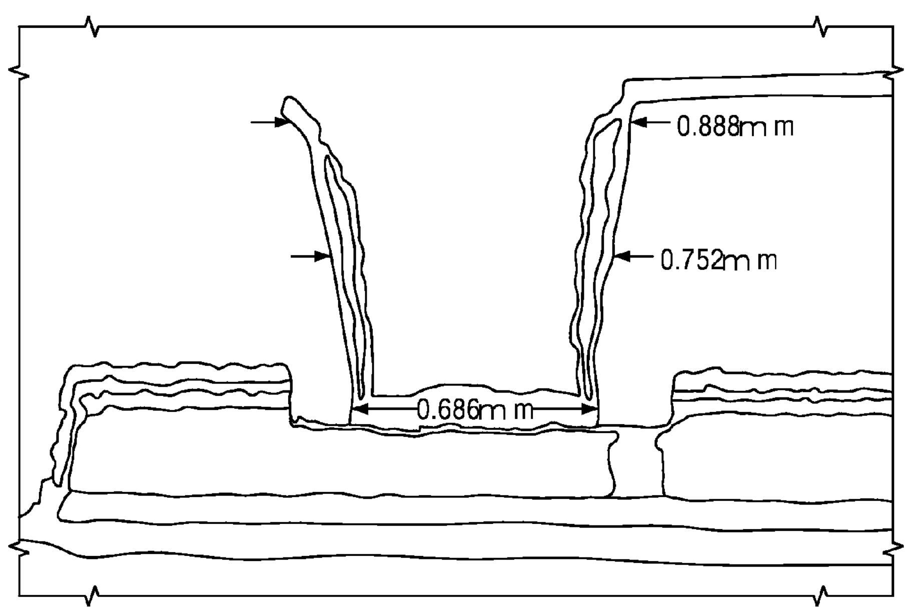
FIGS. 2*a* and 2*b* are diagrams of an electron micrograph of a cross section of a prior art semiconductor device and a data plot of current versus voltage for typical via contacts as shown in FIG. 1.
Figure 2B:
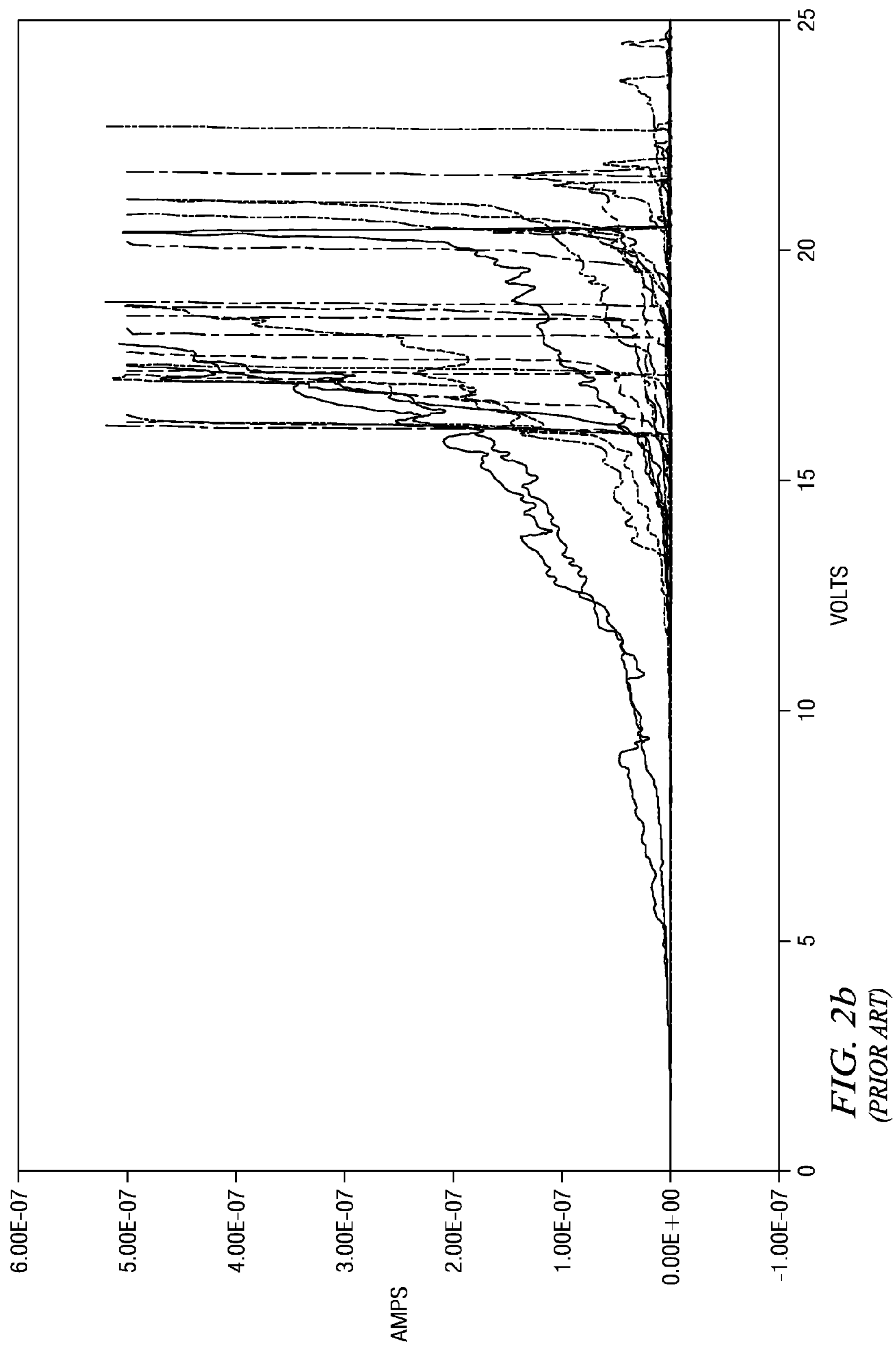

To create electrical contact between the metal layer 410 and a subsequent metal layer (not shown), portions of the oxide layer 420 may be removed. In the prior art technique for creating via contacts shown in FIG. 1, the TiN layer 415 (along with a portion of the metal layer 410) may also be removed in order to help ensure a good electrical contract between the metal layer 410 and the subsequent metal layer.

Figure 4E:
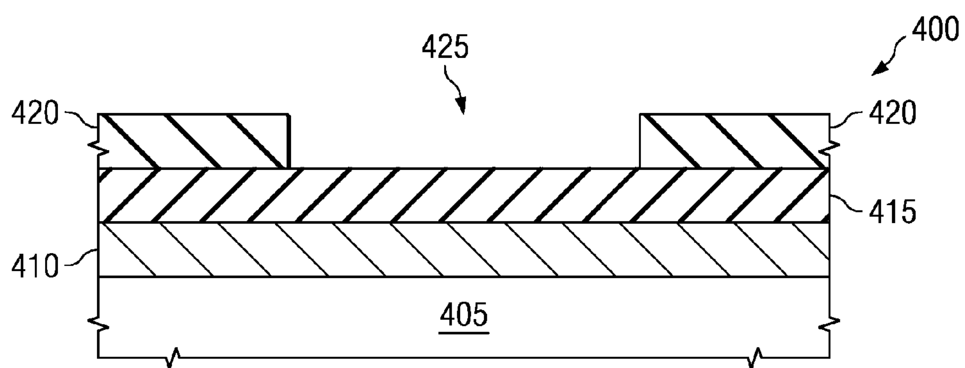

Portions of the oxide layer 420 can be removed using standard etch techniques, such as techniques that involve the use of a photoresist layer that is patterned and then developed to expose the portions of the oxide layer 420 to be removed. The diagram shown in FIG. 4*e* illustrates an opening 425 resulting from the removal of a portion of the oxide layer 420. According to a preferred embodiment of the present invention, the opening 425 can be etched so that it is larger than the actual dimension of the via contact. As discussed previously, the prior art technique shown in FIG. 1 would also include the removal of portions of the TiN layer 415 and part of the metal layer 410 directly underneath the opening 425. The removal of the metal layer 410 may require an additional fabrication process, such as sputter etching.

Figure 4F:
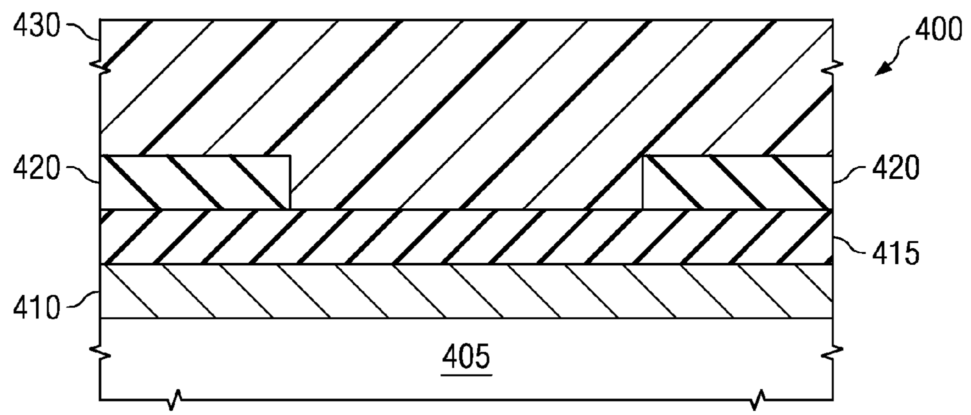

After the removal of portions of the oxide layer 420 and the forming of openings, such as the opening 425, a first spacer layer 430 can be deposited over the semiconductor device 400 (as shown in FIG. 4*f*). The first spacer layer 430 can be used to support the formation of the via contact. According to a preferred embodiment of the present invention, the first spacer layer 430 can be created from a photoresist material that can enable easy removal once the fabrication process of the semiconductor device 400 is complete, using an isotropic etch, for example. The photoresist used in the first spacer layer 430 can be a positive or a negative photoresist, a hard mask material, or so on.

Figure 4G:
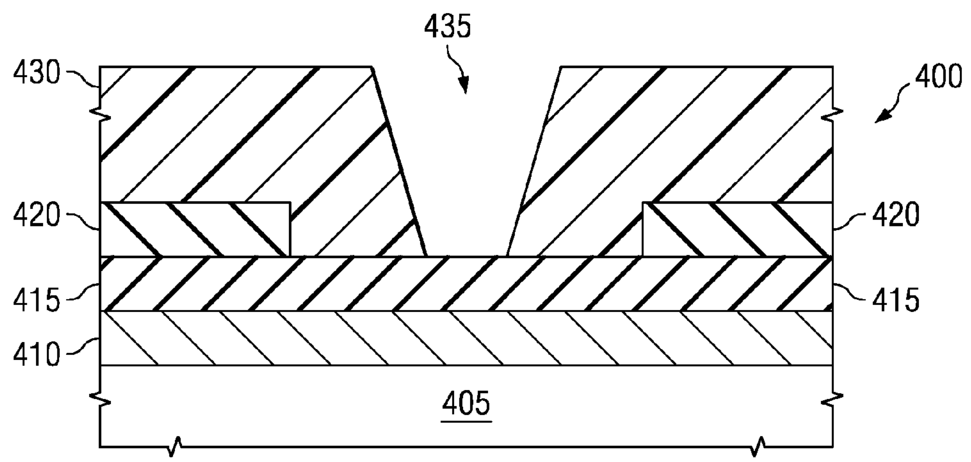
Figure 4H:
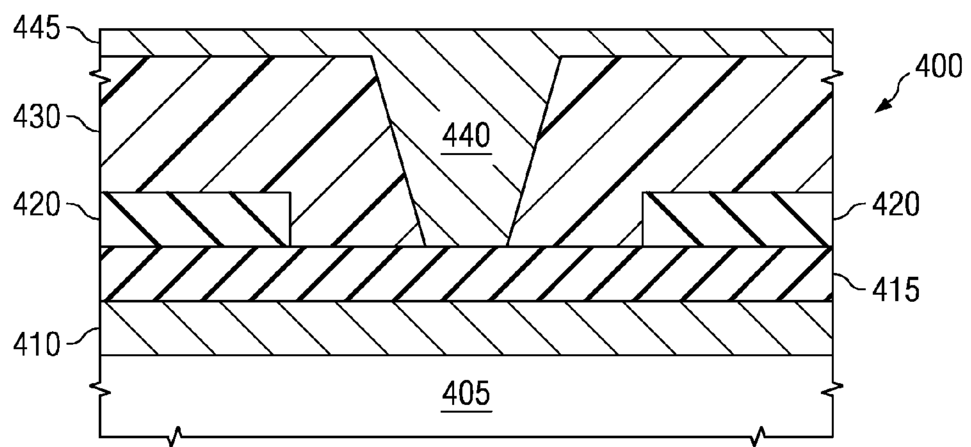
Figure 4I:
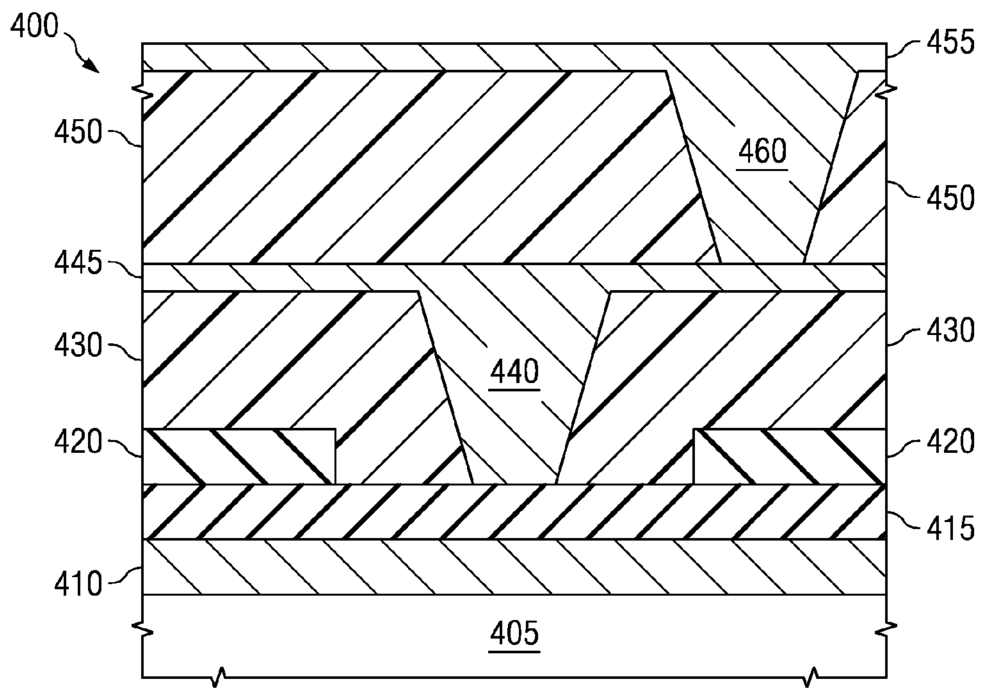

With the deposition of the spacer layer 430, the via contact can be created. The via contact can be created by patterning and developing the first spacer layer 430 utilizing standard photoresist patterning and developing processes, for example. With a via contact opening 435 patterned into the first spacer layer 430, as shown in FIG. 4*g*, the via contact can be created by depositing a metallic material over the first spacer layer 430. The metal material can be deposited using fabrication processes that can ensure good sidewall coverage of the via contact opening 435, such as PVD sputtering.

The presence of the TiN layer 415 can allow for good electrical contact between the metal layer 410 and the metallic material deposited to form the via contact. The TiN layer 415 has protected the metal layer 410 from oxidizing, preventing the formation of a very low-conductive (or non-conductive) layer. Therefore, the electrical connection between the metal layer 410 and the via contact can be a true ohmic connection. The diagram shown in FIG. 4*h* displays an ohmic via contact 440 formed by depositing the metallic material in the via contact opening 435. The ohmic via contact 440 can be a part of a second metal layer 445. The ohmic via contact 440 and the second metal layer 445 can be formed from aluminum, an aluminum alloy, copper, a copper alloy, and so on. The fabrication of the semiconductor device 400 can continue with additional fabrication processes, including the fabrication of additional layers, structures, via contacts, and so forth. The diagram shown in FIG. 4*i* displays the layers of a portion of the DMD. The diagram displays a second spacer layer 450, a second ohmic via contact 460, and a third metal layer 455, all formed using techniques similar to those discussed previously. The ohmic via contact 460 and the second metal layer 455 can be formed from aluminum, an aluminum alloy, copper, a copper alloy, and so on. The photoresist used in the second spacer layer 450 can be a positive or a negative photoresist, a hard mask material, or so on. As with the first spacer layer 430, the second spacer layer 450 can be removed using an isotropic etch, typically during the same isotropic etch used to remove the spacer layer 430. Once the DMD is complete and packaged, the space previously occupied by the first spacer layer 430 and the second spacer layer 450 can be replaced with a gas or a vacuum.

Figure 5:
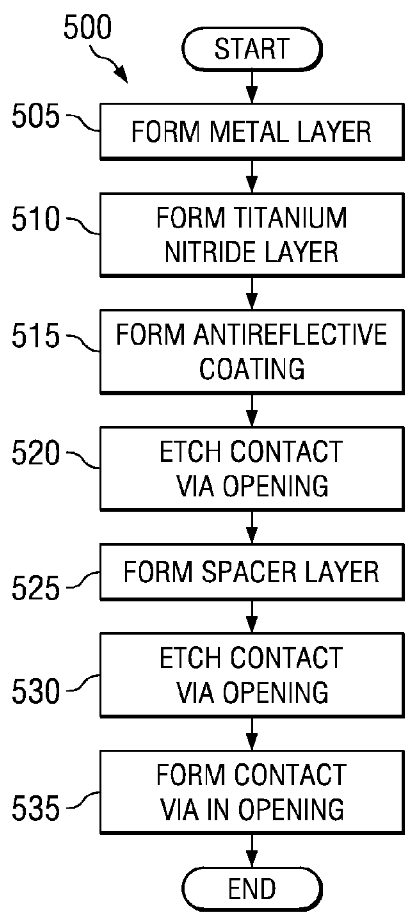
FIG. 5 is a diagram of a sequence of events in the fabrication of a DMD with via contacts, according to a preferred embodiment of the present invention.

With reference now to FIG. 5, there is shown a diagram illustrating a sequence of events 500 in the fabrication of a semiconductor device with via contacts, wherein the semiconductor device comprises a DMD, according to a preferred embodiment of the present invention. The fabrication of the semiconductor device with via contacts can begin with the forming of a metal layer on a substrate (block 505). The metal layer can be formed on a substrate that already has undergone some fabrication and already contains some fabricated structures, such as electrical addressing circuitry, memory cells, and so forth. The formation of the metal layer can include the use of an etching process to create the desired structures of the metal layer on the substrate.

Once the metal layer has been formed on the substrate (block 505), a layer of titanium nitride can be formed over the metal layer (block 510). The TiN layer can serve to protect the metal layer by preventing the formation of an oxide layer on the metal layer as well as creating an electrically conductive coating on the metal layer. In an alternate preferred embodiment of the present invention, a layer of tantalum nitride (TaN) can be used in place of the TiN layer. According to a preferred embodiment of the present invention, the TiN layer can be formed over the portions of the metal layer that will be a part of a via contact. This can be achieved by using a photoresist layer that can be patterned and developed, with the TiN being formed by vapor deposition, for example. Alternatively, the TiN layer can be applied over the entire surface of the DMD and then etched away from portions of the DMD where it is not wanted.

An antireflective coating (ARC) can then be created over the surface of the DMD, which already includes the metal layer and the TiN layer (block 515). The ARC includes an oxide layer and the TiN layer. A typical technique for forming the ARC on the DMD would be to use a CVD fabrication process to form the oxide layer over the TiN layer. Other types of ARCs can be formed over the TiN layer, including types of ARCs that do not utilize the TiN layer. With the ARC formed on the DMD, unwanted portions of the oxide layer can be removed, which can involve the use of standard etching techniques, such as techniques involving the use of photoresist (block 520). An example of where the oxide layer can be removed can be portions of the DMD where via contacts are to be formed. A first spacer layer can then be formed over the DMD (block 525) to provide a surface for the subsequent formation of other structures of the DMD. The first spacer layer can also effectively planarize the surface of the DMD to enable easier fabrication. The first spacer layer can be formed by spin coating a layer of photoresist material, for example.

With the first spacer layer formed, an opening for use in creating the via contact can be created, by etching the first spacer layer, for example (block 530). Once again, typical etching techniques, such as those involving the exposure of the first spacer layer to a pattern that will result in the hardening of portions of the first spacer layer and then washing away either the hardened or unhardened portions of the first spacer layer, can be used. The opening can then be filled with a metallic material, usually by sputter deposition or vapor deposition, creating a via contact with solid mechanical and electrical contact with the metal layer (block 535). The creation of the via contact can coincide with the creation of a second metal layer if the deposition of the metal material used to form the via contact is permitted to continue until a sufficient amount of metal material is deposited on the surface of the first spacer layer. If the second metal layer is not desired, it can be possible to etch away any metal material deposited on the surface of the first spacer layer.

The fabrication of the DMD can then continue with the fabrication of additional DMD structures and layers (not shown in FIG. 5), including a second spacer layer 450 (FIG. 4*i*) formed above the second metal layer 445 (FIG. 4*i*) containing the via contact 440 (FIG. 4*i*) as created in block 535, a third metal layer 455 (FIG. 4*i*) formed over the second spacer layer 450 containing additional via contacts, such as the via contact 460 (FIG. 4*i*), wherein the third metal layer 455 can subsequently be used to create the micromirrors of the DMD. The fabrication of the second spacer layer 450 and the third metal layer 455 containing the additional via contacts can be achieved utilizing techniques as described previously.

Detailed descriptions of DMD fabrication can be found in greater detail in the following coassigned U.S. patents: U.S. Pat. No. 4,566,935, issued Jan. 28, 1986, entitled "Spatial Light Modulator and Method," U.S. Pat. No. 4,662,746, issued May 5, 1987, entitled "Spatial Light Modulator and Method," U.S. Pat. No. 5,083,857, issued Jan. 28, 1992, entitled "Multi-Level Deformable Mirror Device," and U.S. Pat. No. 5,583,688, issued Dec. 10, 1996, entitled "Multi-Level Digital Micromirror Device," which patents are hereby incorporated herein by reference.

Figure 6:
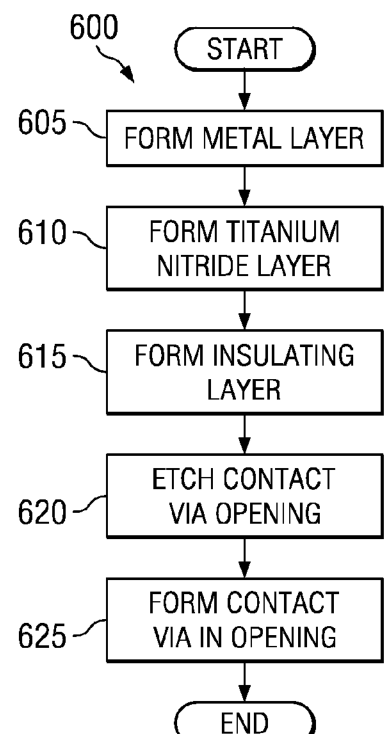
FIG. 6 is a diagram of a sequence of events in the fabrication of a semiconductor device with via contacts, according to a preferred embodiment of the present invention.

With reference now to FIG. 6, there is shown a diagram illustrating a sequence of events 600 in the fabrication of a semiconductor device with ohmic via contacts, according to a preferred embodiment of the present invention. The sequence of events 500 (FIG. 5) illustrates the fabrication of a via contact between metal layers of a DMD, which is a specific embodiment of a semiconductor device. The sequence of events 600 illustrates the fabrication of a via contact in a generic semiconductor device and provides a rudimentary framework for the fabrication of via contacts that have true ohmic behavior in a semiconductor device. An actual embodiment of the present invention may include specific fabrication processes that are dependent on the semiconductor device being fabricated. However, the basic fabrication process will be applicable.

The fabrication of a semiconductor device with via contacts can begin with the formation of a metal layer (block 605). As is previously discussed, the metal layer can be formed over a bare substrate or a substrate already containing previously fabricated structures. The metal layer can be formed from a single layer of a metallic material that can be etched as needed or specific structures can be created using a patterned photoresist material, for example. A titanium nitride layer, or more generally, barrier layer, can then be formed over the metal layer (block 610). As with the metal layer, the TiN layer can be created by etching a single layer that covers the metal layer or specific TiN structures can be created. In an alternate preferred embodiment of the present invention, a barrier layer of tantalum nitride (TaN) can be used in place of the TiN barrier layer.

An insulating layer, such as a layer of an oxide material can then be formed over the metal layer and the TiN layer (block 615). The insulating layer can electrically decouple the metal layer and the TiN layer from a subsequently formed metal layer. An example of the oxide layer can be silicon oxide. After the insulating layer has been formed over the metal layer and the TiN layer, openings in the insulating layer can be created, by etching, for example, to create the via contact (block 620). The via contact can be formed by depositing a metal material over the openings, forming an electrical connection between the metal layers (block 625). The fabrication of the semiconductor device can continue after the formation of the via contacts.

Figure 7A:
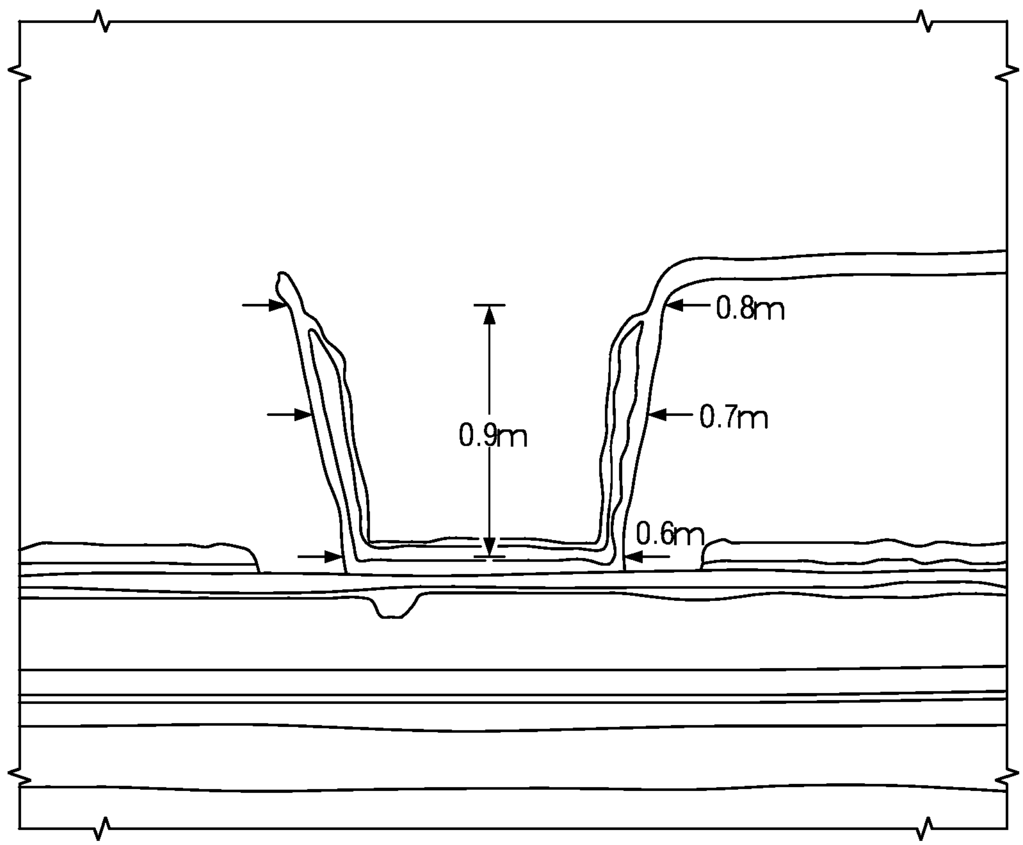
FIGS. 7*a* and 7*b* are diagrams of an electron micrograph of a cross section of a semiconductor device and a data plot of current versus voltage for via contacts fabricated using the sequence of events as shown in FIGS. 5 and 6, according to a preferred embodiment of the present invention.
Figure 7B:
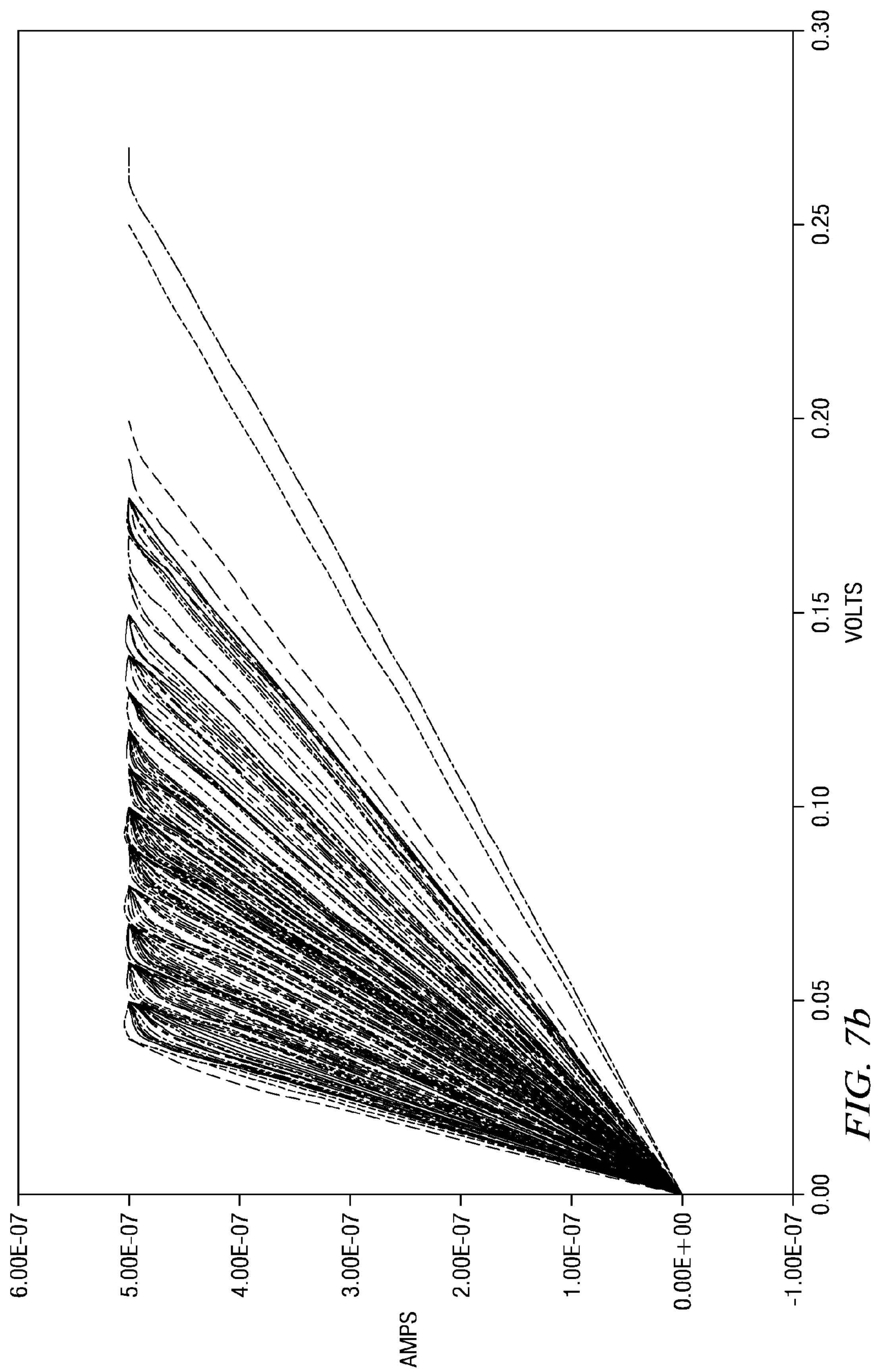

With reference now to FIGS. 7*a* and 7*b*, there are shown diagrams illustrating an electron micrograph of a cross section of a semiconductor device and a data plot of current versus voltage across a via contact, according to a preferred embodiment of the present invention. The diagram shown in FIG. 7*a* illustrates a via formed over a metal layer, wherein an oxide layer formed over the metal layer and the TiN layer has been removed, but a TiN layer (also formed over the metal layer) is left covering the metal layer to protect the metal layer from oxidation. Since the TiN layer is generally conductive, a good electrical bond can be created between the via and the metal layer. The diagram shown in FIG. 7*b* illustrates a data plot of current through exemplary via contacts versus voltage across exemplary via contacts for a large sample of exemplary via contacts. The amperes versus volts plot shown in FIG. 7*b* clearly illustrates the linear relationship between the current that flows through the via contacts and the voltage across the via contacts, which is illustrative of the ohmic nature of the via contacts.

Figure 8:
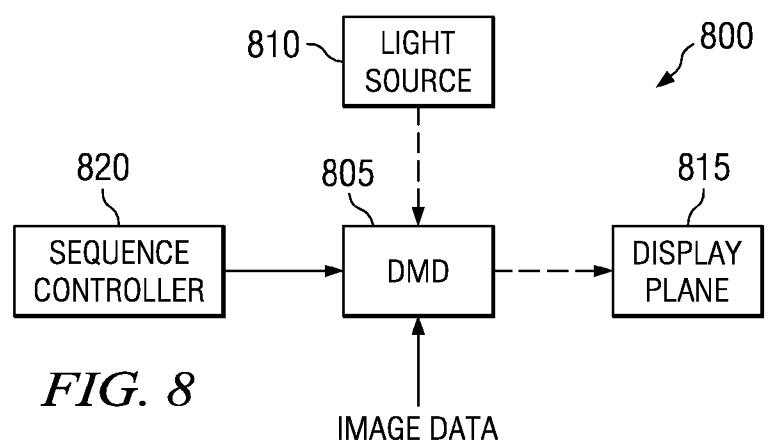
FIG. 8 is a diagram of an exemplary display system, according to a preferred embodiment of the present invention.

With reference now to FIG. 8, there is shown a diagram illustrating an exemplary display system 800, wherein the display system 800 utilizes an array of light modulators, specifically a DMD, to modulate light to produce images on a display plane, according to a preferred embodiment of the present invention. The individual light modulators in the DMD 805 assumes a state that corresponds to image data for an image being displayed by the display system 800, wherein, depending upon the image data, an individual light modulator can either reflect light from a light source 810 away from or towards a display plane 815. A combination of the reflected light from all of the light modulators in the DMD 805 produces an image corresponding to the image data. A sequence controller 820 coordinates the loading of the image data into the DMD 805, controlling the light source 810, and so forth.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a via contact, the method comprising:

forming a metal layer over a substrate;

forming a conductive barrier layer over the metal layer;

depositing an insulating layer over the conductive barrier layer;

creating a first opening in the insulating layer to expose the conductive barrier layer;

depositing a spacer layer on the insulating layer and the exposed conductive barrier layer;

creating a second opening in the spacer layer to re-expose at least a portion of the previously exposed conductive barrier layer; and forming a via contact in the second opening.

2. The method of claim 1, wherein the conductive barrier layer comprises titanium nitride.

3. The method of claim 1, wherein a diameter of the second opening is smaller than a diameter of the first opening.

4. The method of claim 3, wherein the insulating layer comprises an oxide material, and wherein the spacer layer comprises a photoresist material.

5. The method of claim 1, wherein the creating of the first opening comprises etching the insulating layer down to the conductive barrier layer.

6. The method of claim 1, wherein the via contact comprises an electrically conductive material, and wherein the via contact is electrically coupled to the metal layer.

7. The method of claim 1, wherein the conductive barrier layer is formed using physical vapor deposition or chemical vapor deposition.

8. The method of claim 1, further comprising, after the forming of the via contact, removing the spacer layer using an isotropic etch.

9. The method of claim 1, wherein the forming of the via contact also forms a second metal layer overlying and electrically coupled to the via contact.

10. The method of claim 1, further comprising, before the forming of the metal layer over the substrate, forming electrical circuitry in the substrate.

* * * * *

UNITED STATES PATENT AND TRADEMARK OFFICE

CERTIFICATE OF CORRECTION

PATENT NO. : 7,601,624 B2
APPLICATION NO. : 11/520378
DATED : October 13, 2009
INVENTOR(S) : Rothenbury et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 495 days.

Signed and Sealed this

Fifth Day of October, 2010

David J. Kappos
*Director of the United States Patent and Trademark Office*